United States Patent
Thompson (10) Patent No.: US 8,280,323 B2
(45) Date of Patent: Oct. 2, 2012

(54) FUZZY LOGIC CONTROL OF AN RF POWER AMPLIFIER FOR AUTOMATIC SELF-TUNING

(75) Inventor: Rick L. Thompson, Amherst, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 1039 days.

(21) Appl. No.: 11/973,951

(22) Filed: Oct. 11, 2007

(65) Prior Publication Data

US 2008/0090539 A1 Apr. 17, 2008

Related U.S. Application Data

(60) Provisional application No. 60/850,769, filed on Oct. 11, 2006.

(51) Int. Cl.
*H01Q 11/12* (2006.01)
*H04B 1/04* (2006.01)

(52) U.S. Cl. ............ 455/126; 455/127.1; 455/121; 455/125; 455/115.3; 455/107

(58) Field of Classification Search ............ 455/522, 455/107, 114.2, 115.1, 115.3, 120–129, 127.1–127.5
See application file for complete search history.

(56) References Cited

U.S. PATENT DOCUMENTS

| | | | | |
|---|---|---|---|---|
| 5,564,086 A * | 10/1996 | Cygan et al. | ............ | 455/126 |
| 5,862,458 A * | 1/1999 | Ishii | ............ | 455/107 |
| 6,349,216 B1 * | 2/2002 | Alberth et al. | ............ | 455/550.1 |
| 7,146,139 B2 * | 12/2006 | Nevermann | ............ | 455/115.1 |
| 7,221,327 B2 * | 5/2007 | Toncich | ............ | 343/860 |
| 7,379,714 B2 * | 5/2008 | Haque et al. | ............ | 455/107 |
| 7,602,243 B2 * | 10/2009 | Murao | ............ | 330/136 |
| 7,761,065 B2 * | 7/2010 | Drogi et al. | ............ | 455/126 |
| 7,764,125 B2 * | 7/2010 | Dawe | ............ | 330/305 |
| 2002/0086643 A1 * | 7/2002 | Leipala | ............ | 455/80 |
| 2004/0075504 A1 * | 4/2004 | Vintola | ............ | 330/298 |
| 2004/0224649 A1 * | 11/2004 | Shamsaifar | ............ | 455/107 |
| 2005/0059362 A1 * | 3/2005 | Kalajo et al. | ............ | 455/127.1 |
| 2005/0130608 A1 * | 6/2005 | Forse et al. | ............ | 455/120 |
| 2006/0081624 A1 * | 4/2006 | Takada et al. | ............ | 219/716 |
| 2006/0267688 A1 * | 11/2006 | Tanoue et al. | ............ | 330/278 |
| 2008/0290947 A1 * | 11/2008 | Dawe | ............ | 330/282 |
| 2009/0289719 A1 * | 11/2009 | Van Bezooijen et al. | ..... | 330/285 |

* cited by examiner

*Primary Examiner* — Edward Urban
*Assistant Examiner* — Rui Hu
(74) *Attorney, Agent, or Firm* — Daniel J. Long; Robert K. Tendler (57) ABSTRACT

Fuzzy logic is utilized to control an RF amplifier and associated tuner for continuous self-optimization and automatic load matching to at least double the battery life of a battery-powered transmitter.

11 Claims, 8 Drawing Sheets

Fuzzy logic control system algorithm $$\frac{\sum_{p=1}^{m} y_p \prod_{i=1}^{g} \alpha_{aip}}{\sum_{p=1}^{m} \prod_{i=1}^{g} \alpha_{aip}} \quad (1)$$

m = Total number of rules
$y$ = Crisp output of each rule
$\alpha_{aip}$ = Product of membership of each rule function
g = Total number of inputs

Decision Table for Tuning    Power Error

|  | Zero | Low | Medium | High |
|---|---|---|---|---|
| Negative | Positive Very Small | Positive Small | Positive Medium | Positive High |
| Zero |  | Very, very Small | Very Small | Small |
| Positive | Negative Very Small | Negative Small | Negative Medium | Negative High |

Freq Error

If Ferror is Negative and Perror is Zero then tune PVS
If Ferror is Negative and Perror is Small then tune PS
If Ferror is Negative and Perror is Medium then tune PM
If Ferror is Negative and Perror is High then tune PH If Ferror is Zero and Perror is Small then tune VVS
If Ferror is Zero and Perror is Medium then tune VS
If Ferror is Zero and Perror is High then tune S
If Ferror is Positive and Perror is Zero then tune NVS
If Ferror is Positive and Perror is Small then tune NS
If Ferror is Positive and Perror is Medium then tune NM
If Ferror is Positive and Perror is High then tune NH

*Fig. 8*

FUZZY LOGIC CONTROL OF AN RF POWER AMPLIFIER FOR AUTOMATIC SELF-TUNING

RELATED APPLICATIONS

This Application claims rights under 35 USC §119(e) from U.S. application Ser. No. 60/850,769 filed Oct. 11, 2006, the contents of which are incorporated herein by reference.

STATEMENT OF GOVERNMENT INTEREST

This invention was made with United States Government support under Contract No. DAAB07-02-C-P-632, awarded by the Department of the Army. The United States Government has certain rights in the application.

FIELD OF THE INVENTION

This invention relates to conservation of battery power and battery-powered RF transmitters and more particularly to the utilization of fuzzy logic control of an RF power amplifier and associated tuner for continuous self-optimization and automatic load matching, thereby to double the battery life of the battery-powered device.

BACKGROUND OF THE INVENTION

Portable transceivers that include both commercial transceivers such as cell phones and military radios have been battery powered, presently utilizing lithium battery technology to increase the time in which the battery-powered RF device can operate.

Cell phones, two-way radios, Bluetooth devices, and any number of wireless communications units having power amplifiers draw battery power based on the function of the device.

Heretofore there has been no self-adaptive configuration of the RF amplifiers as to, for instance, sense the environment and adapt the tuning associated with the final RF amplifier so that the amplifier is operating as efficiently as possible. It is of course desirable that the amplifier operate in a very linear operating region in terms of temperature and to minimize the standing wave ratio (SWR). Thus, for instance, when an individual using a handheld wireless device stands in a doorway that has a metal frame, the metal frame can detune the antenna or cause a significant mismatch in the impedance between the antenna input and the output of the RF amplifier.

Typically these wireless units are engineered without consideration of the changing environmental conditions in which they will operate; and as a result do not operate as efficiently as possible. The result is undue battery drain when the environmental conditions change at the portable device.

As to cell phones, power management capability is typically managed by the base station in which the power output is determined from the base station. In these cases there is no local tuning or other control of the cell phone RF amplifiers, which is handled externally and not intelligently by the device itself. As will be appreciated, the base station does not take into account any environmental factors such as temperature and changing SWR. Thus it is not the function of the base station to make any adjustments that would limit current drain so that the portable unit does not to run out of power.

While in the past RF transmitters have been provided with automatic antenna tuners, they are large and expensive and while they can measure standing wave ratios, they are not utilized in small handheld low-cost systems. Also the response time of the commercially available automatic antenna tuners oftentimes exceeds several seconds, which is not particularly effective in instantaneously optimizing the power amplifier/antenna portion of the transceiver.

Moreover, the algorithms utilized in automatic antenna tuners can take as many as 100,000 instructions. These sophisticated algorithms require large processors with the attendant latency and massive current consumption. Thus there is always a requirement that one conserve battery power to extend missions, and one cannot conserve battery power utilizing large processors.

There is therefore a need to optimize the RF transmitting section of a transceiver or wireless device so as not to unnecessarily impact battery resources.

What is desirable is to be able to sense the operating conditions at the amplifier and to have a feedback path by which the amplifier and its tuning circuits can be adjusted so as to optimize the RF amplifier as its operation is altered or degraded by the environmental conditions in which it finds itself. Additionally, it would be useful to be able to optimize the RF amplifier and its attendant circuitry in terms of any degradation due to circuit aging so that the RF amplifier portion of the portable device self-adjusts to minimize current drain, thus to extend battery life.

In short, there is a requirement to automatically match an RF power amplifier to a load and to ensure that optimized power is delivered to a load whilst the RF amplifier or connection to the antenna degrades due to environmental conditions.

SUMMARY OF INVENTION

In order to optimize RF power amplifiers for use in battery-powered devices, in accordance with the subject invention, fuzzy logic algorithms are used in a closed loop feedback circuit to apply continuous monitoring and self-correction fine-tuning for the RF power amplifier. This maintains the amplifier in a linear region. If substantial impedance mismatches occur between the amplifier and the antenna, the amplifier operation goes non-linear and can even oscillate, drawing excessive power from the battery and severely limiting battery life. The subject system is useful not only for narrow-band cellular systems but also for WiFi 802.11 transceivers, spread spectrum systems and ultra wideband communications where the frequency rapidly shifts and the antenna tuning must follow.

It has been found that by utilizing fuzzy logic, no more than 1,000 instructions and oftentimes as few as 100 instructions need be used, which minimizes controller power requirements and also limits the optimizing cycle to microseconds.

In one embodiment the fuzzy logic algorithms are programmed on a single integrated circuit due to their simplicity, such that standard low-cost EPROM technology may be utilized. This eliminates the utilization of sophisticated digital signal processors often entailing Pentium processors as well as the massive amount of memory that is required.

In one embodiment, output power and input frequency are sensed and a digital tuner is re-tuned, with the fuzzy logic algorithms controlling the amplifier and the tuner to maintain an impedance match between the amplifier and the antenna and to adjust amplifier gain. By monitoring output power and comparing it to an idealized output power, when the output power changes, adjustments can be quickly made.

It is noted that with respect to cell phones, there is nothing at the cellular telephone that monitors environmental conditions, much less any feedback network to optimize the cellular phone handset operation.

As part of the subject invention, not only is the tuning of the amplifier monitored by monitoring output power, one also can adjust the bias of the amplifier, which changes the gain of the amplifier. If there is a substantial mismatch between the output impedance of the amplifier and the input impedance of the antenna, then by adjusting down the gain of the amplifier the standing wave ratio mismatch can be minimized.

As mentioned above, the use of fuzzy logic is critical to the rapid and low current drain operation of the subject system. It is noted that due to the limited number of instructions necessary in a fuzzy logic algorithm, one can place the algorithm on a single chip without the use of external components. If one has 100 instructions to tune the associated RF amplifier and the clock rate of the microcontroller executing the instruction is 1 MHz, even with a slow processor one can use the 100 instructions to do an overall tuning operation in the millisecond range. Thus one can use an extremely slow computer chip embedded controller running at 1 MHz. In summary, with only 100 to 1,000 instructions, even with a 1 MHz clock one achieves millisecond cycle times.

The primary motivation for using fuzzy logic is that it does not have to have an absolute deterministic value. For instance a rule table can be set up by an expert that specifies that if certain sensed parameters are in a certain range, change the tuner state to a predetermined state that results in a better match. Fuzzy logic thus deals in ranges as opposed to absolute values. Moreover, fuzzy logic, because it groups data into ranges, operates on a much-reduced data set, with the fuzzy logic making a decision when the result using this reduced data set is good enough or close enough. Thus if the result is between 90 and 95% close to the ideal, then this type of operation is sufficient, at least in the subject case to save as much as five times on the battery drain by optimizing the RF amplifier/antenna circuit.

While military radios have been designed for optimized battery life, up to the present time there has been no attention to optimizing the RF section of the transceiver or transmitter on the fly. While at the design phase of these wireless devices optimization techniques are used, environmental degradation can cause a significant mismatch and degradation of the operation of the amplifier so that it operates outside of its linear region. If one were able to re-tune the amplifier and/or set its gain parameters appropriately, one could multiply the battery life by at least two times and as much as five times.

The external factors affecting the transmit scenario relate in part to the problem of an antenna being placed next to a metal structure, inside of a building or even out in the open. Environmentally induced detuning can result in antenna gain changes. For instance, if an antenna is optimized for a 3 dB gain in an ideal environment, if suddenly a soldier stands under a metal door frame and is talking on the wireless device, the antenna now, for instance, may be one inch away from the metal frame. Thus the antenna gain may go down to 2 dB or may even go to zero. A drop of 1 dB can cost at least half the power. Since portable wireless devices are meant to be moved around, non-optimal operation, if detected, can result in the opportunity to optimize of the RF amplification section of the transceiver.

The use of fuzzy logic algorithms provides an architecture that is expandable. For instance, while in the subject example one senses output power and input frequency, one could provide the fuzzy logic with any number of different sensors. One could be monitoring temperature as well as the lifetime of the device in addition to power and frequency. For instance, if one knows the slope of the amplifier changes, one could optimize the amplifier to counteract these changes.

In fact, fuzzy logic is so simple that by just adding ten lines of code one can monitor an additional sensor and include the result in the feedback network.

The result is that low-cost radios can be placed in the hands of soldiers in a platoon where the design goal would be a 24- to 48-hour mission. For instance, if the soldiers are going out on a convoy, one would like to have the battery outlast the planned mission.

In one embodiment of the subject invention, sensed parameters are used by the fuzzy logic to control an antenna tuner with an initial setup resulting in a set of ideal impedance points on the Smith Chart describing an acceptable 1:1 SWR antenna match. Thereafter new sensed parameters result in different impedance points on the Smith Chart. The distance between the new Smith Chart points and those in the ideal set is ascertained. The fuzzy logic through its rules and based on this error signal generates a digital tuner control signal to reconfigure the tuner to reduce the error. In a next iteration, new sensed parameters result in a new error signal used to control the amplifier tuner. This results in a new Smith Chart position. If this new Smith Chart position is sufficiently close to the ideal position, the process is stopped. If not, a fine-tuning algorithm is invoked.

When the resulting Smith Chart position is close enough to an idealized set of Smith Chart positions, the amplifier operates in a linear region. If the SWR becomes too high the amplifier can operate in a non-linear and even oscillating region, which draws excessive power.

If the transceiver is a frequency- or band-hopping radio, keeping the SWR under control is a problem, especially for spread spectrum military radios or ultra wideband devices. While cell phones are narrow-band devices, WiFi transmitters can also operate in wideband. In all of these cases maintaining the RF final amplifiers in a linear range is problematic.

Thus in the subject system, after initialization, a Smith Chart position is detected based on measured data. The fuzzy logic algorithm then establishes what actions are necessary to drive the Smith chart position to the area or region of the Smith chart that is close to the desired 1:1 SWR.

For instance, if the antenna is designed to have a 50-Ohm input impedance and the output of the amplifier is designed to have an output impedance of 50 Ohms, then there is a position or area on the Smith chart that corresponds to this.

When environmental factors change the antenna input impedance or the RF amplifier output impedance, then these conditions are sensed and the position on the resulting Smith Chart position is detected. The distance between the point determined by these conditions and the optimal 1:1 SWR point on the Smith chart is detected and feedback signals are applied to either the tuning apparatus for the amplifier or to control the gain of the amplifier to drive this point towards the desired 1:1 SWR point on the Smith chart.

It has been found that only three such tuning cycles are needed in order to place the RF amplifier/antenna circuit at a relatively optimal point, which can be done with as few as 100 lines of code and in milliseconds.

In order to do so, the fuzzy logic sets are set up using a series of definitions called membership functions to which variables are assigned. The membership functions are then put in the fuzzy logic sets which are stored in memory.

When the radio is turned on these sets are pulled out of memory and are loaded to set up the tuner. Thereafter, the fuzzy logic algorithm is run to initialize the system, which means selecting initial tuner states.

Thereafter, power and frequency measurements are made to ascertain output power error, the magnitude of which forms an error signal.

As a result of the three iterations in the above example, one has tuned the amplifier/tuner circuit to its optimum point, assuring amplifier linearity.

If after the first three iterations as mentioned above there is no satisfactory movement of the Smith chart point, then one drops into a fine-tune mode. In order to prevent oscillation or non-convergence in the fine-tune mode, the number of tuning steps in the fine-tune mode is limited to a maximum number of iterations.

Put another way, given a particular tuner, the tuner can take on many different tuning states that result in various points on the Smith Chart. Taking, for instance, ten tuning states, this means the tuner can take on ten different configurations. It is the purpose of the fuzzy logic algorithm to pick the tuning state that makes the amplifier operate in a linear region. How the algorithm does this is as follows:

Initially one establishes an initial tuning state that is the ideal or benchmark that provides linear amplifier performance, i.e., corresponds to a 1:1 SWR. One then has in the above example nine other tuning states, which gives nine different Smith Chart points or results. The distance from each of these points to the ideal point is described by a weight that is assigned to the corresponding tuning state.

In one embodiment, the microprocessor is pre-loaded with the ten tuning states and their corresponding weights.

The initial ideal tuning state corresponds to a 1:1 SWR for a given frequency input to the RF power amplifier.

Then one turns on the transceiver and measures the output power and input frequency. From the absolute magnitudes of these two measurements the distance of the corresponding Smith Chart tuning state point to the ideal point is determined in terms of a weight. The fuzzy logic, using weights, then computes a tuning state that will result in a Smith Chart point closer to the ideal point; and the tuner is set accordingly.

After selecting this new tuning state, the transceiver potentially outputs a different output power and/or different frequency. The different power and different frequency are compared against the initialized values to derive another error signal corresponding to a weight which is used to pick a new tuning state.

The magnitude of the error signal is used to pick a tuning state that will result in a decrease in the distance between the point on the Smith Chart previously obtained and the ideal point.

In essence the fuzzy logic is utilized to pick the tuning state that results in a Smith Chart point that is closer to the ideal Smith Chart tuning state point.

Instead of having only ten tuning states, which are not enough to cover the Smith Chart, in one embodiment the tuner is designed to have 2,048 tuning states, which results in enough points to cover the Smith Chart.

However, fuzzy logic cannot efficiently handle 2,048 tuning states. What is required is a reduced data set and this is accomplished by grouping these 2,048 tuning states in one embodiment into five sets to be able to more quickly handle the data.

However, fuzzy logic efficiently handles 2,048 tuning states by grouping large amounts of data into sets. This reduced data set is accomplished by grouping these 2,048 tuning states in one embodiment into five sets for the fuzzy logic algorithms to be able to more quickly process the data.

Thus for five sets there are approximately 400 different tuning states in a set, each with a different weight.

How the sets are formed will be described hereinafter. Note that each set is designed so that tuning states that have similar characteristics are grouped in a set. In setting up the sets an expert designates five representative tuning states and thus five weights per set. These representative tuning states may be selected to correspond to Smith Chart points at the center, up, down, left and right in the Smith Chart area corresponding to the set.

Thereafter and within each set there is a root mean square average weight for the five selected weights for the set. This root mean square average is compared to the magnitude of the error signal, and the tuning state corresponding to the root mean square average that results in a closer Smith Chart point is selected for controlling the tuner.

Thus the root mean square average of five representative weights is used to make a decision as to how to tune the tuner.

By way of example, in order to specify the tuning states, a technician would take a given tuner and measure the Smith Chart point for each of the tuning states, with the results loaded in memory.

How the tuning states are grouped into sets is basically determined by an expert who must know fuzzy logic, at least to make a rough good set of data specifying each of the sets so that like tuning states are grouped together in a set.

One way to do this is as follows:

Assuming a digitally controlled tuner, for instance having 8-bit control, the technician could designate 0, 0, 0, 0, 0, 0, 0, 0 as being "Tuning State 1." "Tuning State 2" might be 0, 0, 0, 0, 0, 0, 0, 1. The technician would then sequence from "Tuning State 2" up to "Tuning State 400" and designate this as the first set.

While this may sound arbitrary, because one is using a particular digitally controlled tuner, by selecting sequential numbers one identifies tuner states having closely similar characteristics.

The above process corresponds to coarse tuner control; and the result after these iterations may be close enough to let the tuner remain unchanged.

It has been found that in the above example it takes only three iterations to select a tuner state to obtain close to a 1:1 SWR so that the amplifier operates in its linear region. This in turn minimizes battery drain and can extend battery life five-fold.

While the above has described the tuner control, it is also possible with the above fuzzy logic to control amplifier biasing and thus gain, again to minimize SWR. Also a number of parameters other than input frequency and output power such as temperature and circuit aging can be used to maintain linear operation of the amplifier.

In summary, fuzzy logic is utilized to control an RF amplifier and associated tuner for continuous self-optimization and automatic load matching to at least double the battery life of a battery-powered transmitter.

BRIEF DESCRIPTION OF THE DRAWINGS

These and other features of the subject invention will be better understood in connection with the Detailed Description, in conjunction with the Drawings, of which.

DETAILED DESCRIPTION

Figure 1:
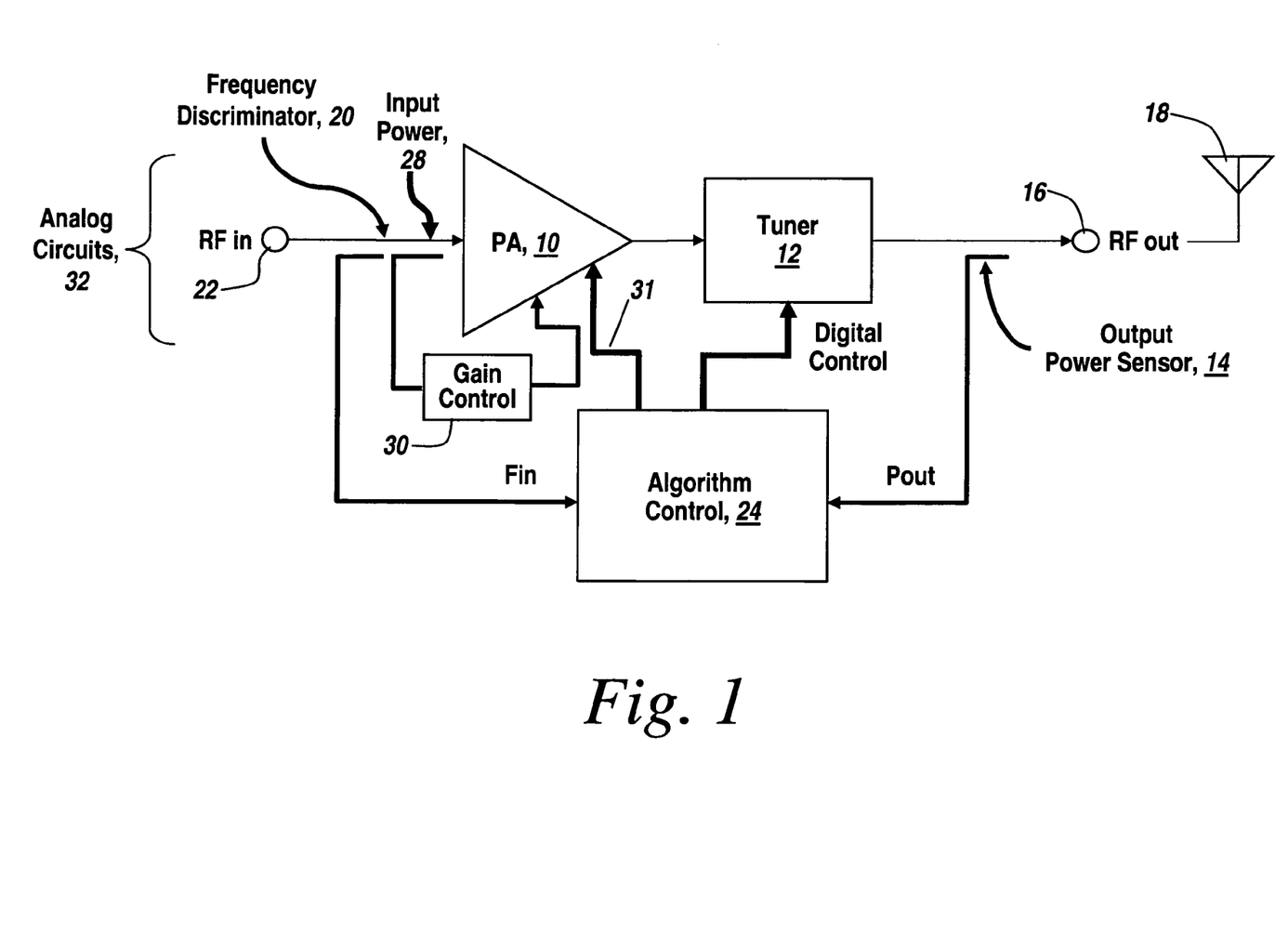
FIG. 1 is a block diagram of the subject fuzzy logic control system for the control of a tuner coupled to an amplifier in which input frequency and output power is monitored for the control of the tuner and in which input power is monitored for gain control of the amplifier.

Referring now to FIG. 1, an RF power amplifier 10 is coupled to a suitable tuner 12 which in one embodiment for microwave frequencies is a double-stub tuner that is digitally controlled. An output power sensor 14 is located adjacent the RF output 16 of tuner 12 to provide a measure of the output power that will be delivered to an antenna 18.

Also provided as an input to the subject system is a frequency discriminator 20 that measures the frequency of an RF input signal at RF input 22.

These two measured quantities, namely the input frequency and the output power, are coupled to a fuzzy logic control circuit 24, which provides for digital control of tuner 12 over line 26.

Additionally, RF input power is measured at 28 and is applied to a gain control algorithm in unit 30 that controls the bias for power amplifier 10.

While a separate control loop may be provided for gain control of the RF amplifier, in a further embodiment of the subject invention amplifier gain may be controlled by fuzzy logic control circuit 24 operating under an appropriate rule set to lower the amplifier gain in the presence of a large SWR mismatch between the amplifier and the antenna. This control is indicated by reference character 31 on a line between the control circuit and the amplifier.

In short, one has analog circuits 32 that provide a signal to RF input terminal 22, with the fuzzy logic control algorithm in control circuit 24 providing intelligent control for auto-tuning to be able to match the amplifier output impedance to the antenna input impedance.

Figure 2:
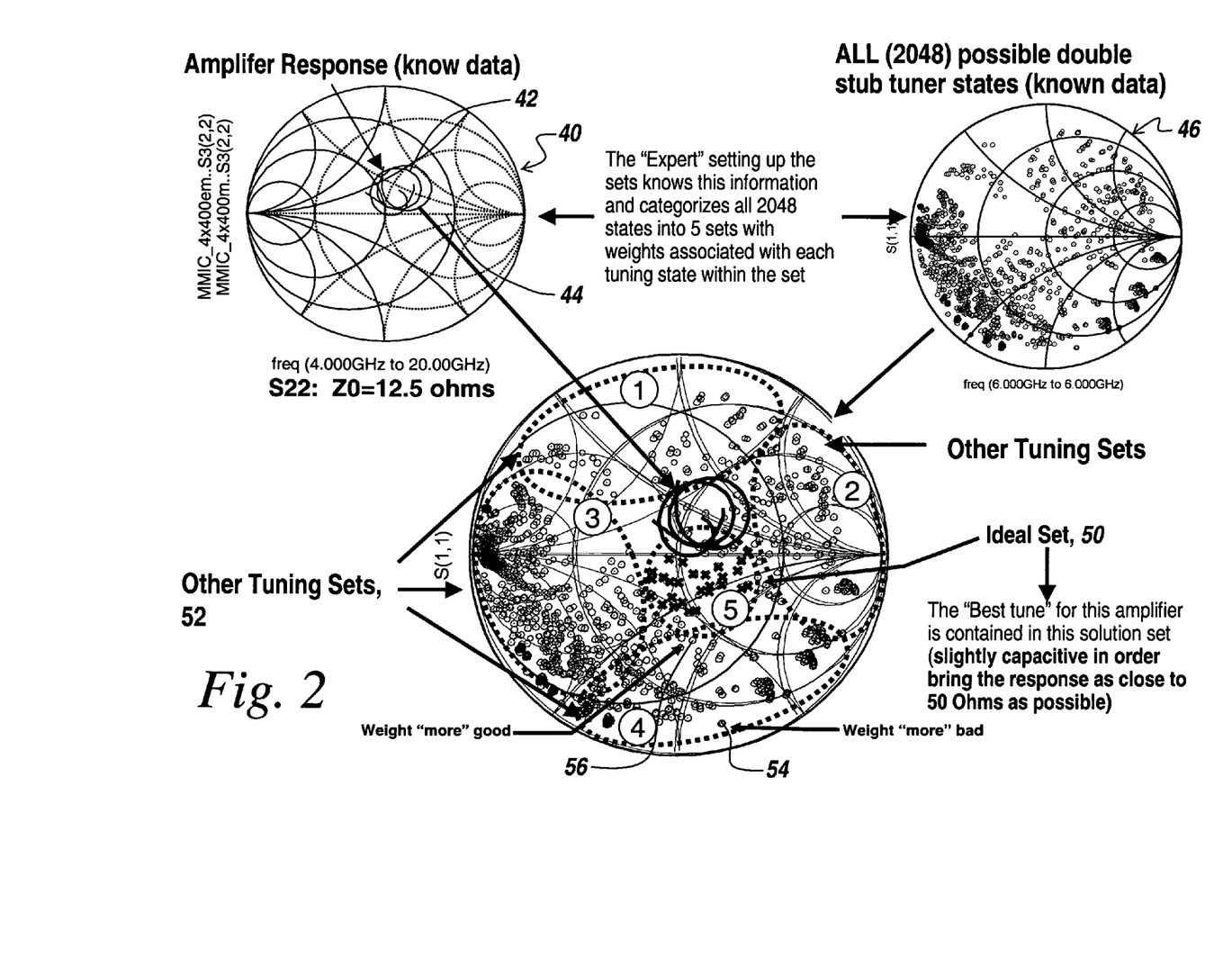
FIG. 2 is a diagrammatic illustration of amplifier response on a Smith Chart, the possible tuner states for a given tuner, in one embodiment a double-stub tuner, and the generation of a number of tuning state sets, the average weight of which is to be compared with the average weight of an ideal tuning state set indicating an acceptable match between the amplifier and tuner of FIG. 1.

Referring now to FIG. 2, as described in combined Smith Chart 40, the combined amplifier/tuner response that experts say will provide the most linear operation of the amplifier is shown at 42 to be positioned, for instance, slightly above the 50-Ohm impedance 44 and slightly to the right of dead center.

In one embodiment the digitally controlled double-stub tuner has 2,048 states, with the corresponding impedance points of the tuner states shown in Smith Chart 46. Thus, for each frequency there are 2,048 possible tuner states, with the pattern on Smith Chart 46 varying depending on the input frequency.

As mentioned hereinbefore, fuzzy logic eschews the utilization of so much data and the 2,048 possible tuner states are divided up into five sets. The ideal set, here shown at 50, is that which results in a minimum impedance mismatch between the amplifier and the antenna of FIG. 1. This set is labeled Set 5 in the FIG. 2 diagram.

Other tuning sets 52 are as illustrated and contain impedance points that are the result of closely related tuner states.

Referring specifically to Set Number 4, it will be appreciated that each of the impedance points is given a weight depending on how far the point is to Set 5. This weight is a vector having both a magnitude and a direction.

Referring to impedance point 54 in Set 4, its distance and direction to Set 5 in accordance with its assigned weight will be larger or "more bad," whereas for impedance point 56, the distance and thus the weight assigned to this point is "more good."

Due to the use of fuzzy logic, with impedance points grouped in sets as indicated above, the average point in a set is determined by the root mean square average of all the points in the set. It is from this average point that distance to the ideal set is measured.

As will be discussed, the measurement of output power and input frequency relative to an initialized set of values allows one to derive a weight vector such that having derived the weight vector, one can generate a digital control signal applied to the tuner to tune the tuner to a point that will result in an impedance point on the Smith Chart that is closer to the ideal set.

Rather than processing data for 2,048 possible double-stub tuner states, one infers from the measured data how to go from a point within an outlying set to the ideal set. The weight for so doing is converted into a tuner state that minimizes the weight.

Figure 3:
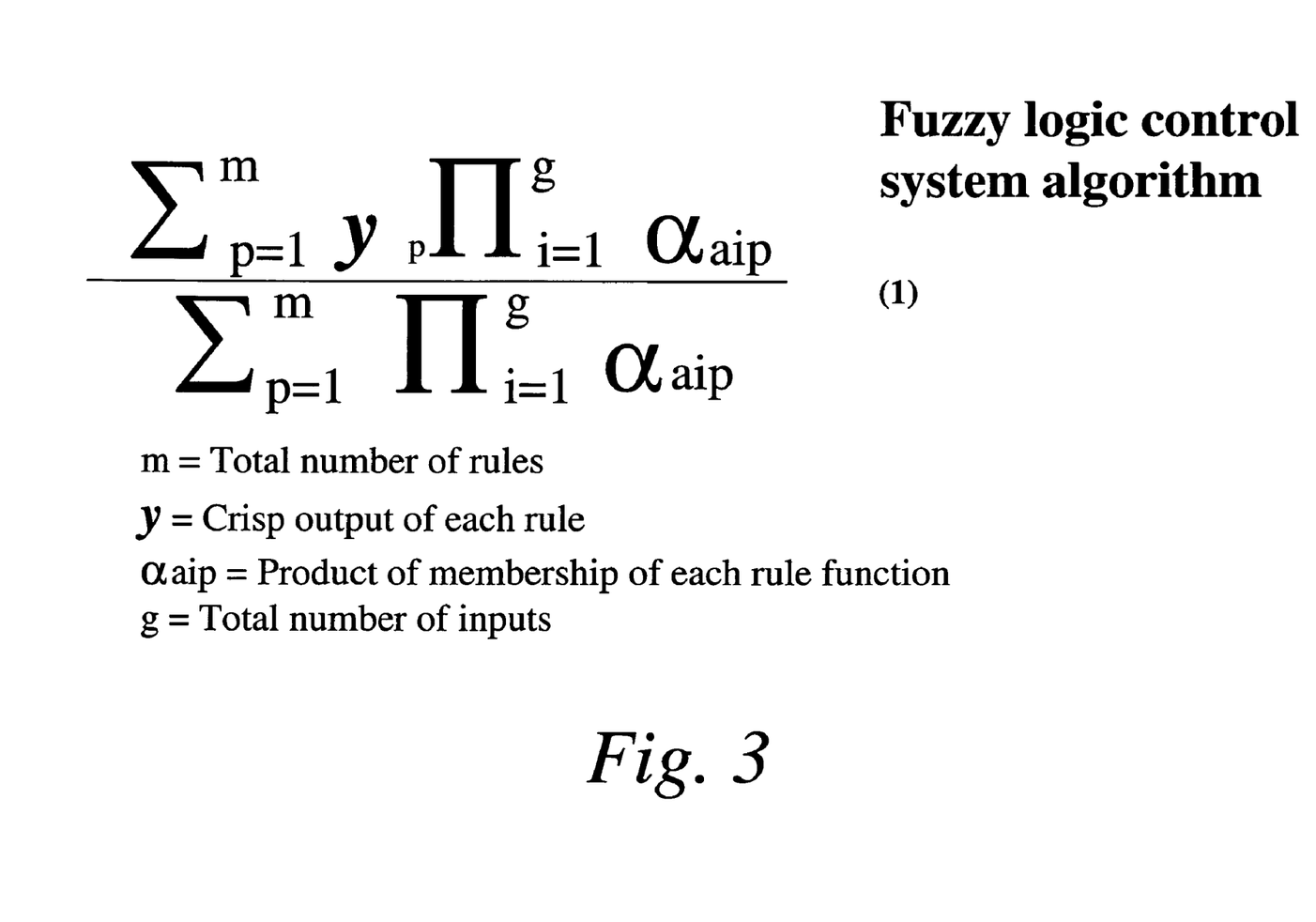
FIG. 3 is a diagrammatic illustration of the impedance-matching algorithm containing the fuzzy logic control for the subject system.

All of this is accomplished through a fuzzy logic control system impedance-matching algorithm. In this algorithm, sensor inputs are received by the system and evaluated. The antecedent (if x and y) blocks test the inputs and produce conclusions. The subsequent (then z) blocks of some rules are satisfied while others are not. The conclusions are combined to form logical sums. The conclusions are then fed into the inference process where each response output member function's firing strength (0 to 1) is determined.

How the impedance-matching algorithm operates is now discussed.

Figure 4:
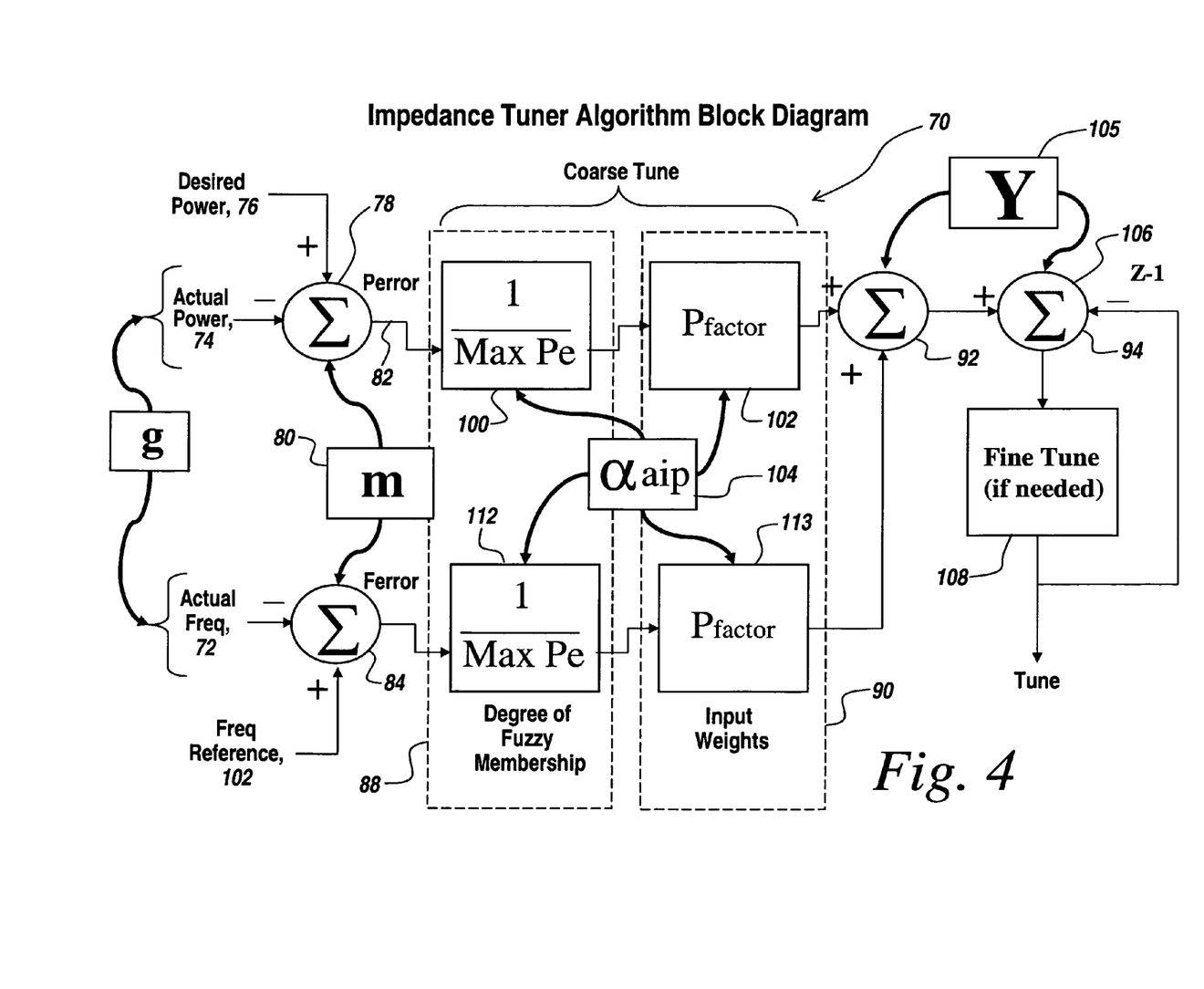
FIG. 4 is an impedance tuner algorithm block diagram illustrating the detection of output power and input frequency, the derivation of error signals and the implementation of a coarse tune algorithm for providing weight vectors to set the tuner of FIG. 1 by generating appropriate digital commands.

Prior to discussing the operation of the system described in FIG. 4, the way that the fuzzy logic operates is that it works in sets. In the most general sense, one set is the universe. It is all of the possibilities that one could have for the tuner.

Then as described above there is an ideal tuning solution in the form of an ideal set. The way that the fuzzy logic works is by making a decision as it tries to solve how far away one is from where one wants to go, namely the ideal tuning set.

The way the system works is to make a measurement of how far the sensed data is from the optimum data. In a series of measurements one knows when the weight derived is closer or not so close to the weights associated with the ideal set.

If the algorithm taking the measured data knows that the weight is too great, then for the next iteration the tuning must go in a different direction to minimize the magnitude of the error signal.

The Algorithm Theory of Operation

The equation in FIG. 3, which maps the system input to input, is specified by:

$$\frac{\sum_{p=1}^{m} y_p \prod_{i=1}^{g} \alpha aip}{\sum_{p=1}^{m} \prod_{i=1}^{g} \alpha aip}$$

where m is the total number of rules, y is the crisp output for each rule, αaip is the product of the membership functions of each rule input, and g is the total number of inputs. In the first iteration of the intelligent transmitter, g will be defined to be the three sensor inputs (frequency in, power input, and power output). The final implementation of this algorithm may have a g with as many as five inputs (power in, frequency in, power out, temperature, and waveform discrimination). The membership functions are mapped according to inputs and to outputs. The input membership functions are a range of sensor parameters for each g, as is disclosed in H. Hagras, V. Callaghan, M. Colley, "Developing an outdoor fuzzy logic controlled agricultural vehicle for crop following and harvesting," the contents of which are incorporated herein by reference.

In the intelligent transmitter, two inputs (actual power and actual frequency) are continuously monitored and compared to the desired power output level and a reference frequency. The evaluation of these two inputs establish error signals. The magnitude of each error signal is based upon the logical rule set established in the algorithm. For example, if the amount to tune is small, then the magnitude of the error is small. Conversely, if the amount to tune is large, then a large error signal will be generated. The logical evaluation of the inputs and the generation of the error signal or signals is executed by a Boolean superset called fuzzy logic. Basically, the fuzzy logic evaluates all sensor inputs that are received by the system concurrently. The antecedent (If X and &) blocks test the inputs and produce conclusions. The subsequent (Then Z) blocks of some rules are satisfied while others are not. The conclusions are combined to form logical sums. Therefore, the algorithm constantly monitors the system and always makes a decision to tune or not. Implemented in code, this results in very fast adaptation times.

The fuzzy logic algorithm uses fuzzy reasoning to model the system characteristics. Lotfi A. Zadeh introduced the concept of fuzzy logic in 1965, as is disclosed in L. Zadeh, "Fuzzy Sets," Informat. Conf. Vol. 8, pp. 338-353, 1965, the contents of which are incorporated herein by reference. This work emphasized that humans are better at control than conventional controllers because they make effective decisions on the basis of imprecise linguistic information. His proposition was using a Boolean superset, i.e., a degree of possibilities in between a logical true and a logical false, that he termed fuzzy logic. Applied to the control of various systems, fuzzy logic describes the system behavior based upon "our" knowledge of the system. Complex or simple relationships between system variables are characterized no matter what their analytical dependence. This is performed by a rule set in the form of "IF a set of conditions is satisfied, then a set of conclusions is inferred, as disclosed in P. Branco, J. Dente, "An experiment in automatic modeling an electrical drive system using fuzzy logic," IEEE Transactions on Systems, Man and Cybernetics, Vol. 28, Part C, No. 2, May 1998, the contents of which are incorporated herein by reference. This is depicted in the following equation:

$R^{(l)}$: If $x_i$ is $A_1^{(l)}$ and $x_2$ is $A_2^{(l)}$ ... and $x_m$ is $A_m^{(l)}$ then y is $B^{(l)}$ The symbol $R^{(l)}$ ($1 \leq l \leq c$) corresponds to the lth model rule among a total of c rules, xj ($1 \leq j \leq m$) is the m chosen system variable expressing the system condition, y is the system output variable, and ỹ is the inferred value from the fuzzy model.

The conclusions of the fuzzy logic evaluation are fed into the inference process, where each response output member function's firing strength or truth level (0 to 1) is determined. This process by which the inference engine computes this uses the error signal magnitude to select a tuning range. In other words, the membership functions will contain the optimized tune for the system, and it is the job of the inference engine to make the tuning decisions. The equation for the membership function is as follows:

$\mu_{A1}^{(l)}{}_{x...xAm}{}^{(l)}(x1,...,xm) = \mu_{A1}^{(l)}(x_1) + ... + \mu_{Am}^{(l)}(x_m)$

In each rule, $A_j(1)$ is the fuzzy set (linguistic term) and is characterized by a membership function:

$\mu_{A1}^{(l)}(x_j)$

Finally, the fuzzy set $B^{(1)}$ represents the conclusion part of the rule.

A weighting system is applied to the membership functions in order to assign a ratio of true and false association to each decision. For example, if the decision is arrived at that is exactly between two tuning ranges, then one weight factor assignment could be 50% true or 50% false. However, the system is trained such that previous lessons learned indicate that a 70% true and a 30% false weight is more desirable. This inference process is depicted as the following:

$$Y = \frac{\sum_{l=1}^{c} \mu(R^{(1)}) \omega^{(1)}}{\sum_{l=1}^{c} \mu(R^{(b)})}$$

Y depicts the inferred model output, i.e., the optimized tuning solution, $\omega^{(1)}$ is the logical evaluation result of each rule, $\mu(R^{(1)})$ is the activation rule degree (the weighting factors), and c is the number of rules after domain partition. Once a very narrow range of solutions is determined the final decision is then mathematically derived using several different algorithms: root-sum-square, center-of-gravity, and MIN-MAX.

Application of the Expert Inference System to the Intelligent Transmitter

This section will describe the application of the algorithm for autonomous control of the amplifier/tuner circuit. Referring now to FIG. 4, this figure shows the architecture of the amplifier control system called herein the intelligent transmitter.

As described earlier, the inputs to the fuzzy controller, here shown at 70, are input frequency 72 and output power 74.

A power input sensor is used to adjust gain to keep the input to the power amp in the optimum range. Furthermore, both the power output sensor and the frequency input sensor are monitored and used to adjust the impedance matching network for best power added efficiency (PAE).

Referring now to FIG. 4, the actual output power is measured as 74, whereas the actual input frequency is measured at 72.

The desired output power is illustrated at 76 and it is to this desired output power that the actual detected power is compared. These two powers are placed into a summing junction 78, which in accordance with the rules m 80 provides an output power error signal on line 82.

Likewise, the actual input frequency at 72 is compared to a reference frequency 82, with these two signals provided to a summing junction 84, again provided with rules to provide a frequency error signal applied to line 86. These two error signals are applied to a coarse tune unit 70 comprised of Degree-of-fuzziness Membership Unit 88 and Input Weight unit 90, the combined outputs of which at 92 determine a weight vector that is converted into a digital tuner tuning signal.

While the subject system in essence utilizes two tuning steps, namely a coarse tuning step and a fine tuning step, what is described now is the coarse tune in which the tuning states are grouped into sets, depending on what the error is. The coarse tuning apparatus goes through a process to see if the error gets better or worse and if the result is within the desired range, then that signal from element 94 is used in the tuning process.

It will be appreciated that the coarse tuning section of the subject system is composed of Degree-of-fuzziness Membership Block 88 and Input Weights Block 90, with process respectively the output power error signal and the input frequency error signal.

With respect to the Degree-of-fuzziness Membership Block 88, the power error signal and the frequency error signal are coupled to respective blocks 100 and 101, the function of which is to generate a result corresponding to the root mean square of the error signal coupled at its input. The root mean square function's purpose is to ascertain how far one is from the desired power or frequency. Once the Degree-of-fuzziness Membership calculation is made, its output signal is applied to the appropriate P factor block, respectively 102 and 103 in Input Weights Block 90, the purpose of which is to generate a weight. The weight is used to define what tuning state the tuner of FIG. 1 is to take on.

Thus coarse tune unit 70, using fuzzy logic, ascertains how far the sensed values of power and frequency are from the ideal values that would result in a 1:1 SWR and generates a weight having both a magnitude and a direction. The sum of these weights constitutes an output 105 that is used to generate a digital code for the control of the tuner of FIG. 1.

Since the system operates on root mean square average to describe the distance between a set of tuning states to a set corresponding to the ideal tuning state, this weight is used to feed back a signal to re-tune the tuner.

In short, 1/max PE is an error ratio, with the magnitude of the ratio determining whether the present setting of the tuner is "good" or "bad." If it is "good," one proceeds to the final tuning step. If not, the system performs another iteration.

With the coarse tuning one wishes to start with an impedance point that is a large distance away from the ideal impedance point. So one purposely picks an impedance point that is further away to start out with.

What is done by the P factor blocks 102 and 103 is as follows. Having determined from blocks 100 and 101 whether or not the ratio is bad or good, these blocks calculate weight vectors, with these weights being used to derive digital control signals to re-tune the tuner.

Note that g is the total number of inputs, m is a rule and α is the product. Y, here shown at 105, is the output weight that is used to define the digital signal to the tuner.

The rules m established at 80 are arbitrary. What one does is to pick a point on the Smith Chart that is far away, that is to say at the extreme side of the Smith Chart. The rule m then says to pick a point on the Smith Chart which could be, for instance, halfway to the ideal Smith Chart value. Thus one rule would be to always pick as a first step a halfway point or halfway weight between the measured point and the ideal point.

One could arbitrarily choose that the first point be in the capacitive region on the Smith Chart or one could also pick a point that is in the inductive region.

Initialization Procedure

Figure 5:
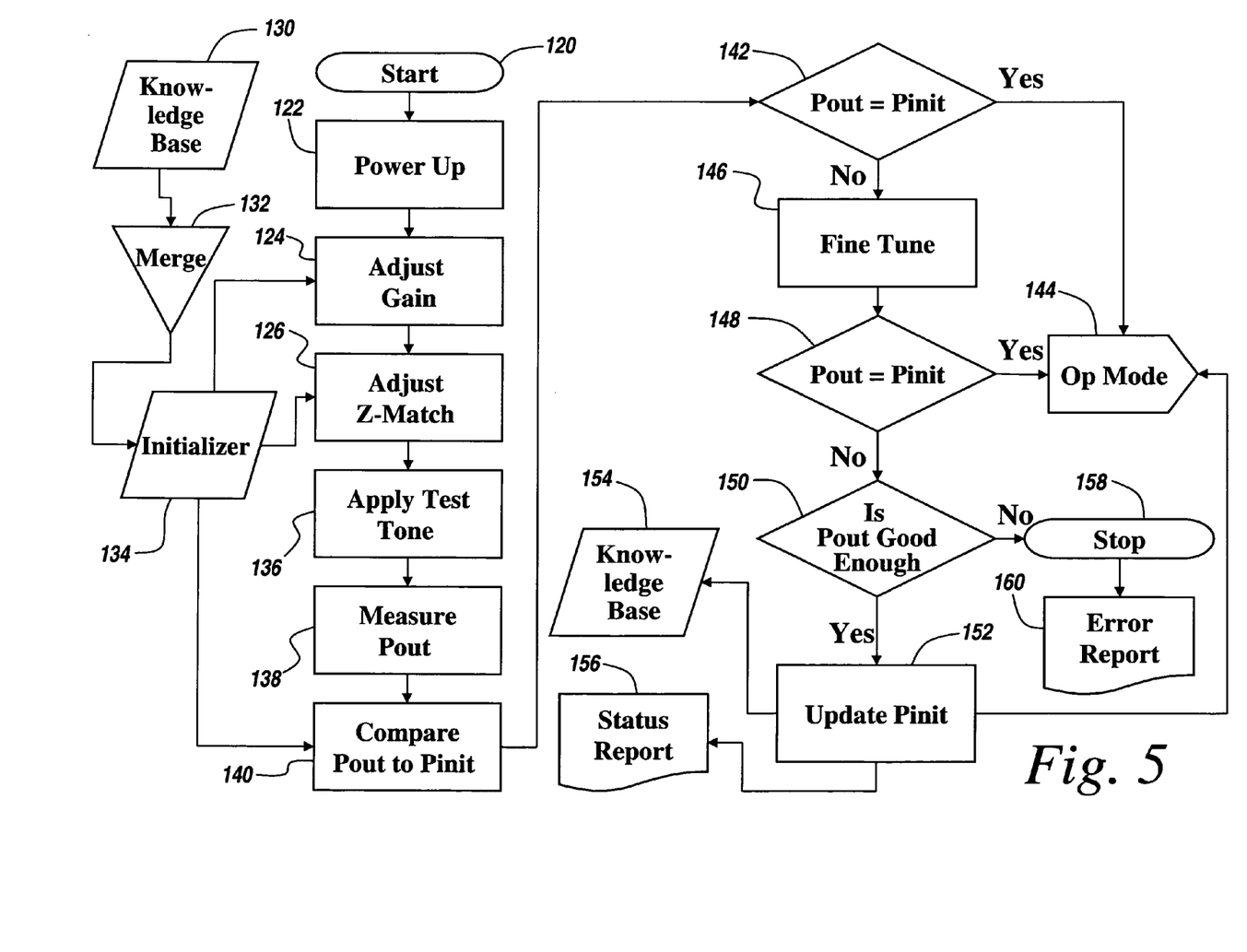
FIG. 5 is a flow chart for the initialization of the subject system.

Referring now to FIG. 5 and the initialization procedure, to start and as illustrated at 120, one powers up the transmitter at 122, from which the gain of the amplifier is adjusted at 124 and the tuner is adjusted at 126. These are adjusted utilizing a knowledge base 130 with all of the information merged at 132 and placed into an initializer 134, which consists of a table or tables with different setup conditions.

After having set up the gain for the amplifier and the tuner state, one applies a test tone at 136 to the amplifier and measures the output power from the output power measuring point as illustrated at 138. The output power is compared to the initialization or ideal output power as illustrated at 140 and if the output power matches the initial output power specified as illustrated at 142, one moves into the Operation Mode as illustrated at 144.

If not, another iteration or fine tune is performed at 146, with a measurement then seeking to ascertain if, after the fine tuning, the output power matches the initialization output power as illustrated at 148. If so, one enters the Operation Mode 144. If not, one makes a determination at 150 as to whether the initialized value of P-out is good enough. If so, the system is updated at 152, with the knowledge base 154 likewise being updated to indicate what parameters are considered sufficiently good. A status report is generated at 156 and one again enters the Operation Mode 144. If the output power after final fine tuning is not good enough, then the process is stopped as illustrated at 158 and an error report is generated as illustrated at 160.

What is accomplished by the aforementioned initialization is to set up initial conditions for the particular amplifier and the particular tuner so that the linearity of the amplifier and/or the mismatch between the amplifier and the antenna can be measured and an appropriate error signal generated as described in FIG. 4.

More particularly, in order to establish the ability to learn or to adapt to new operating parameters, the following premise is established to enable a learning capability. The system must be initialized upon power-up and put into known states for starting conditions. In other words, how can the system learn if it does not know what to base new information on as a point of comparison? Part of the learning experience has to include some sort of memory function, to assess changes over time, or perhaps to predict a degradation of performance. The determination of these states is adaptable based upon knowledge gained (or learned) during operation. The system employs a mechanism to merge the knowledge gained in operation to the initialization settings. Therefore, the system has memory for future functionality and decision-making. The power-up initialization uses calibration to verify operational parameters. The frequency in one embodiment is normalized at 12 GHz for the sole purpose of extracting logic rules for the system, with maximum output power retained in the knowledge base of the system. The actual maximum power out will be ascertained if any changes occur in the system.

As mentioned above, the flow chart begins with power-up, which means that only system power is applied, but no input signal. The starting gain adjustments are fetched from an "Initial Settings" function and applied to a segmented gate amplifier (SGA) for the known magnitude and frequency of the test tone. Concurrently, the impedance transformer is also tuned to its initial settings from the same function. The test tone is applied and $P_{out}$ is measured. $P_{out}$ is then compared to $P_{init}$ (initialization setting) and if they are equal, the system is ready for operational mode. However, if $P_{out} \neq P_{init}$, then the system enters into the fuzzy logic control algorithm to fine tune. At this point again $P_{out}$ is measured. If $P_{out} = P_{init}$ based upon this new tune, then the system is ready for operational mode and the new tuning parameters are input in to the knowledge file. In one embodiment, the new tuning parameters are time stamped in order for the knowledge function to keep track of system changes over time. If, however, $P_{out} \neq P_{init}$, then the system could not reach its previous optimized tune and this means that some circuit level parameters have changed drastically. Then the system is at a critical junction. "Is $P_{out}$ good enough" will be determined by a preset in the initialization file. If it is deemed that $P_{out}$ is indeed good enough, then the system enters operation mode and subsequently the knowledge file is updated and as an option, a status report is issued to the system.

Intelligent Transmitter Operational Mode

Figure 6:
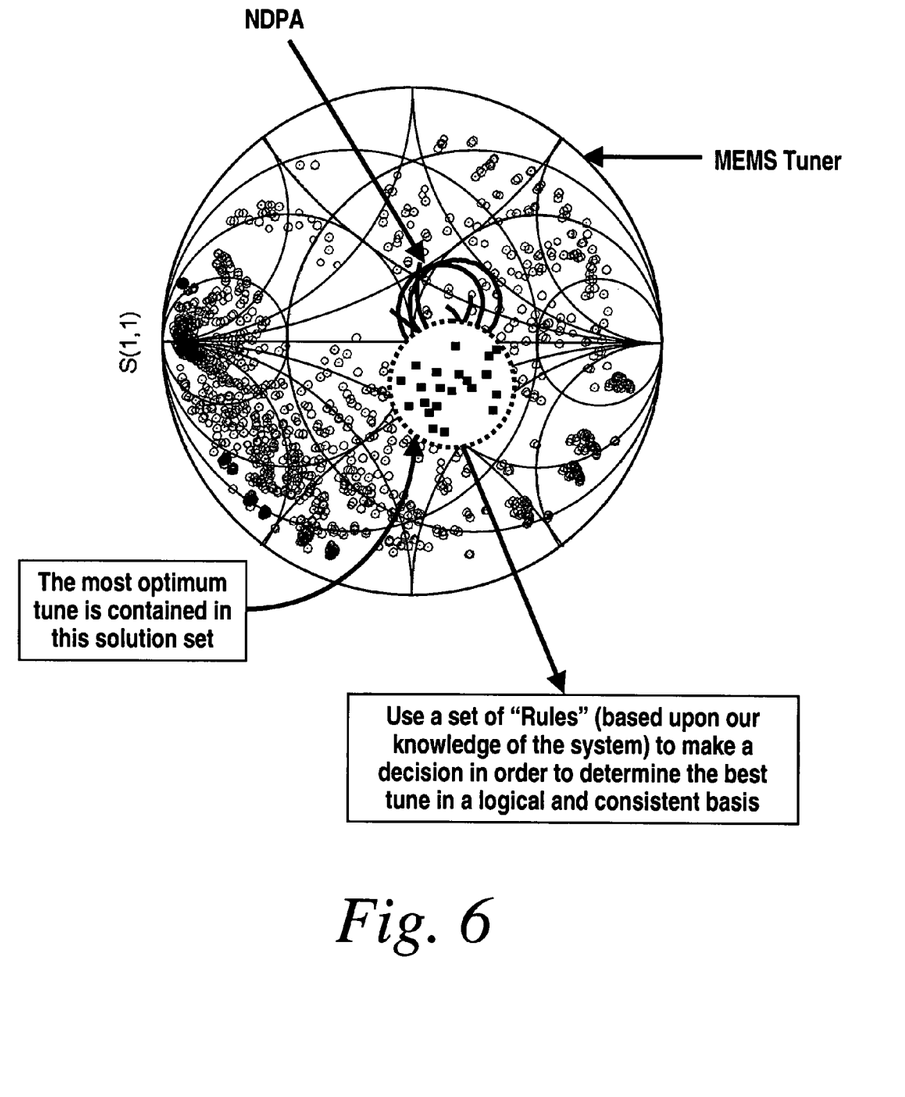
FIG. 6 is a diagrammatic illustration of an overlapping Smith Chart for impedance transformation indicating a set of impedance points for an ideal set corresponding to the most optimum tune for the tuner of FIG. 1.

As discussed previously, the intelligent transmitter uses an expert-based knowledge system with a fuzzy logic kernel control algorithm. The control of the transmitter is rule-based, meaning that the control is based upon an expert's knowledge of how to tune the system. The rules can be quite comprehensive to render expert control of the system to a high degree of accuracy. As a general tenet, rule-based systems are structured, systematic, repeatable, predictable, and code efficient. Therefore, if indeed the algorithm were based upon our knowledge of the system, then the question is begged, how would a human tune the subject transceiver? FIG. 6 illustrates the tuning issues.

The Smith Chart response in one embodiment is shown for a non-uniform distributed power amplifier, NDPA, which is the power amplifier in the transmitter. The response is slightly inductive. As a point of discussion, a look-up table could be employed containing the complex conjugate for every point of the power output. However, there are several drawbacks with a look-up table. First of all, for the 11-bit tuner, there would be 2048 states. Computation time required to compare all the states would be significant, slowing the response down. Further, 2048 states imply a one-dimensional or a one-input system. To evaluate more than one input requires an n-dimensional table, resulting in n-factor more states to evaluate. Perhaps the most compelling argument against a look-up table is that there is no provision for a decision-making process. And finally, if the circuit parameters change over time, the look-up table does not provide a mechanism for adaptability. In other words, the values stored in the look-up table become invalid.

In the case of a rule-based system, one of the rules will be if the Frequency is x and the Power is y, then tune z. This means that the rules will select the optimum frequency range and adjust the tuner. For the Smith chart shown in FIG. 6, this will result in the selection of the optimum result in the maximum $P_{out}$. Since the response of the amplifier is slightly inductive, with the real part being close to 50 ohms, the tuning solution set is established for that particular frequency set that is slightly capacitive to bring the imaginary part close to zero.

Note, the transmitter is in operational mode at the completion of the initialization phase. It is shown in the diagram that a digital feed-forward algorithm will be used for gain adjust. Thus stated, the remainder of this discussion will illustrate the flow chart of the control algorithm. The system continuously monitors $P_{out}$ and $F_{in}$ (power output and frequency input) and compares those values to those known values in the initialization file (even though these values may have been updated from the knowledge function). A rule set allows the monitoring of the entire bandwidth from 6 to 18 GHz. Therefore, if the frequency were to change, the frequency discriminator will sense the change in frequency and the algorithm will scan all the rules that apply to frequency behavior simultaneously.

Figure 7:
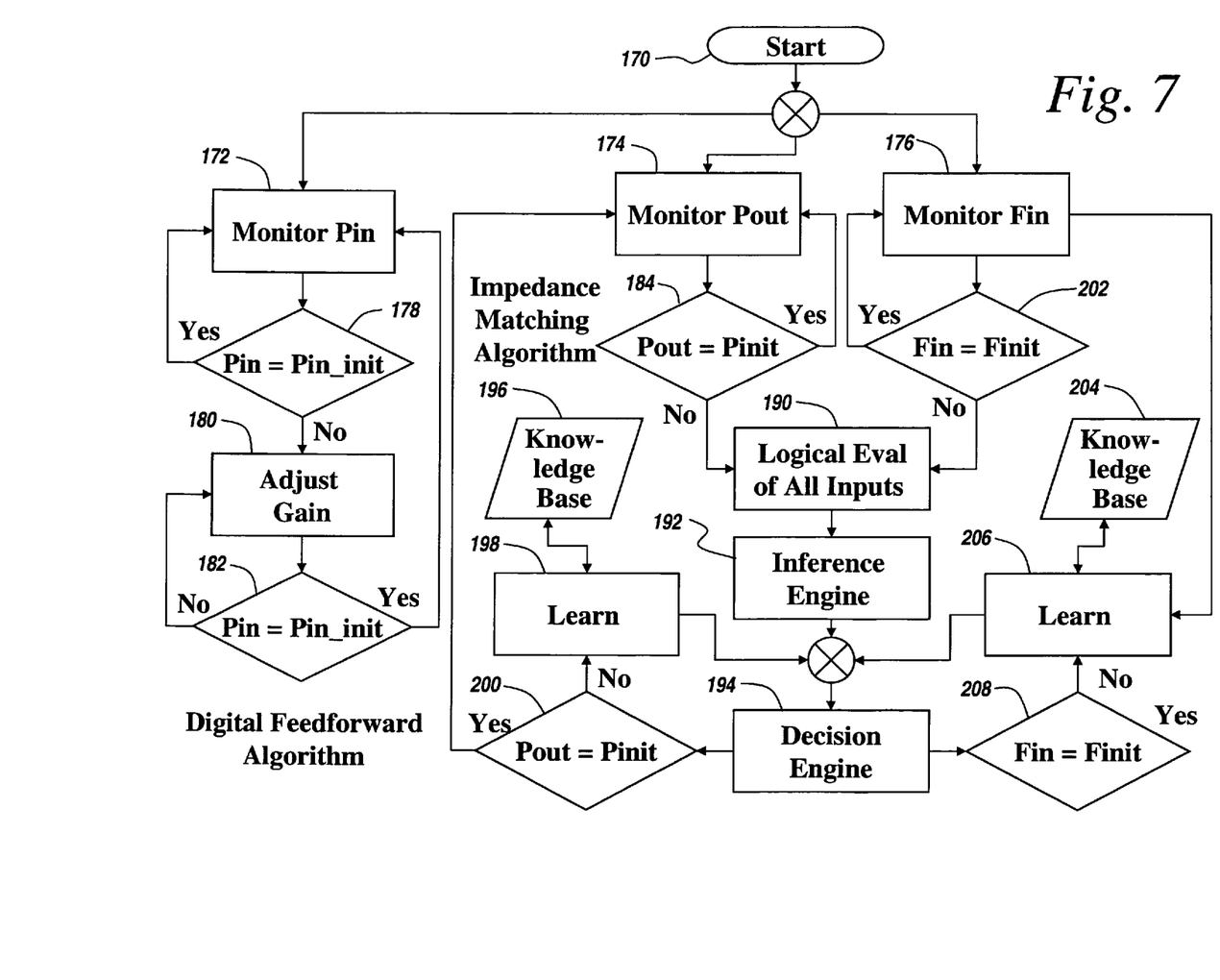
FIG. 7 is a flow chart indicating a digital feed forward algorithm that uses fuzzy logic to control the digital tuner in FIG. 1, as well as monitoring and adjusting gain of the amplifier of FIG. 1; and, FIG. 8 is a decision table showing fuzzy logic rules for setting the tuner states for the tuner of FIG. 1.

More particularly, FIG. 7 shows the flow chart for the operational mode of the transmitter.

In the operational mode of the transmitter, as can be seen at 170, the process is started simultaneously monitoring the input power at monitor 172, the output power at monitor 174, and the output frequency at 176. With respect to the input power control, the monitored input power is compared with the input power in the initialization procedure as illustrated at 178. If these two entities are not equal, the amplifier is adjusted at 180 and the result is measured. If the result shows that the input power equals the initialized input power as determined at 182, then there is no further gain adjustment. If they are not equal, adjustment is attempted.

With respect to the monitoring of the output power, as far as the impedance matching algorithm is concerned, the monitored output power is compared at 184 to the initialized output power and if they are the same then the process stops.

If the output power does not equal the initialized output power, then for the logical evaluation of all outputs, box 190 is called up. It is at this box where the fuzzy logic compares the sensed output power with the initialized output power.

The result of the evaluation or what could be a comparison step is coupled to an inference engine 192. It is here at the inference engine that the root mean square process is initiated to determine a weight corresponding to the error signals based on how bad the initial measured condition was. The inference engine then causes the tuner to re-tune.

The output of the inference engine 192 is applied to a decision engine 194. Also inputted into the decision engine is an input from knowledge base 196 and a learned function 198, the purpose of which is to derive a smarter tuning scenario.

For instance, if one tunes nine times, if every time the transceiver is turned on it goes through this process and knows where a good tune is, then the process is placed in the memory and the results can be used at the output of the inference engine to effectuate a good tune.

As a result, the output of the inference engine is used to generate the digital code that is coupled to the tuner for re-tuning.

Note that if the output of the decision engine results in the output power equaling the initial output power as illustrated at 200, then no learning is indicated.

The same processing is true for the monitoring of the input frequency, which is monitored at decision block 202 and with knowledge base 204 being updated through a learning process 206 that assists the inference engine. Decision engine 194 is again invoked by decision block 208 to ascertain if the input frequency is the same as the initialized value. If not, learning process 206 is updated.

The Role of Fuzzy Logic

Figure 8:
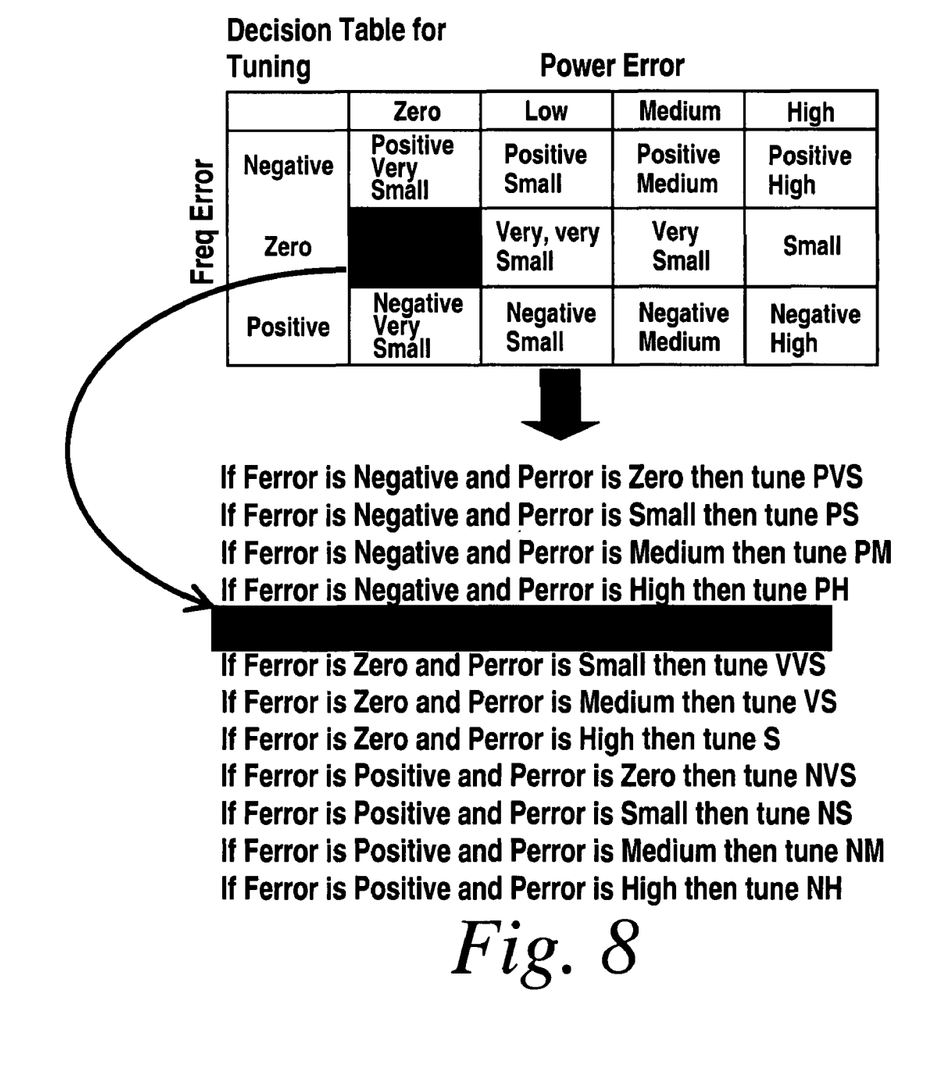

As can be seen from FIG. 8, a decision table is used to determine what type of control signal is to be applied back to the tuner of FIG. 1. It is here that the fuzzy logic comes into play.

In FIG. 8, the decision table, which is an instantiation of a fuzzy logic rule set, maps the decisions against the power and frequency errors in the system. The rules follow the fuzzy equations IF x and y Then z format described earlier. The rule "Tune Zero" will not be satisfied until maximum $P_{out}$ is achieved. The degree of frequency error is based on the initialization of the normalized 12 GHz response. When the frequency error is positive, then the system will need to tune negative and conversely if the frequency error is positive, then the system will tune negative to achieve the best response. It may seem oversimplified, but this logical table covers the entire spectrum of input frequencies, output power, and possible responses. Even though the output is not exactly clear at this point, this does form the basis of a fuzzy logic system. In the vernacular, this is termed "fuzzification" and is the first step in the inference process. The next step in the inference process is computation of the logical values (more than one may be valid, even though in this example only one rule was legitimate) and the application of fuzzy math to derive the membership functions, meaning to select a solution set and solve.

Specifically, from FIG. 8, it can be seen, if $F_{error}$ is negative and $P_{error}$ is zero, then according to the tuner code one has a very small positive, VPS, correction. If $F_{error}$ is negative and $P_{error}$ is small, then there is a positive small, PS, tuner code coupled to the tuner. If $F_{error}$ is negative and $P_{error}$ is medium, then the tuner code, PM, indicates a medium positive shift for the tuner. If $F_{error}$ is negative and $P_{error}$ is high, then one needs a positive high tuning shift, PH.

The above discusses the case where $F_{error}$ is negative. Below on this table is discussed conditions where $F_{error}$ is either zero or positive, with the indicated tuner codes indicated to shift the tuner in the presented manner.

How high is high, or how low is small, is based on rules set up by the expert and offers the type of imprecision afforded by the fuzzy logic.

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A method for controlling an RF power amplifier and tuner connected between the RF power amplifier and an antenna using a fuzzy logic algorithm operating on Smith chart based calculations of the impedance match between the output of the RF power amplifier and the antenna input in a closed loop feedback circuit comprising the steps of:

sensing the frequency of the RF signal applied to the RF power amplifier to monitor the amplifier performance of the RF power amplifier in a continuous monitoring step; and applying a self-correction tuning that reduces any impedance mismatch, the RF power amplifier having an input signal coupled thereto, the monitoring step including the step of monitoring the output power of the RF power amplifier and the input frequency of the RF input signal applied to the RF power amplifier and utilizing the results of the sensed output power and the input frequency for calculating tuner settings for controlling the tuner to provide a better match between the RF power amplifier and the antenna.

2. The method of claim 1, wherein the fuzzy logic algorithm includes a fuzzy logic rule set, whereby decisions are made in the tuning of the tuner based on fuzzy logic principles.

3. The method of claim 1, wherein the fuzzy logic algorithm operates from a knowledge base derived from an expert including Smith chart calculations.

4. The method of claim 3, wherein the tuner is capable of a number of discrete tuning states and in which the discrete tuning states cover a combined Smith Chart that specifies the impedance match between the output of the amplifier and the antenna input and wherein the knowledge base includes tuning states of the tuner.

5. The method of claim 4, wherein the tuning states that describe the match between amplifier and antenna are grouped into a number of sets of tuning states, with tuning states in a set having similar properties.

6. The method of claim 5, wherein for a given tuner a set of ideal tuning states resulting in a close to 1:1 SWR is designated.

7. The method of claim 6, wherein each of the tuning states in a non-ideal set is described by a weight that includes the distance of a tuning state to an ideal tuning state and the direction thereof.

8. The method of claim 7, and further including a unit for generating an error signal corresponding to the difference between an output power associated with a point on the Smith Chart within the ideal set and a frequency difference between the sensed frequency and that associated with the point on the Smith Chart associated with the ideal set, the error signal including a distance and direction to the ideal point.

9. The method of claim 8, wherein the magnitude and direction of the error signal is used to set the tuner state such that the resultant impedance point on the Smith Chart is closer to the ideal point.

10. The method of claim 5, wherein the use of sets of tuning states reduces the amount of data used by the fuzzy logic algorithm and concomitantly the complexity of the computation, thus to minimize battery power requirements.

11. The method of claim 1, wherein the amplifier is battery powered and wherein the fuzzy logic control assures that the amplifier is operating in a linear region, thus to minimize battery drain.

* * * * *